(12) United States Patent
Yasunaga et al.

(10) Patent No.: US 6,566,740 B2
(45) Date of Patent: May 20, 2003

(54) LEAD FRAME FOR A SEMICONDUCTOR DEVICE AND METHOD OF MANUFACTURING A SEMICONDUCTOR DEVICE

(75) Inventors: Shoshi Yasunaga, Kitakyushu (JP); Jun Sugimoto, Kitakyushu (JP)

(73) Assignee: Mitsui High-tec, Inc., Fukuoka (JP)

( * ) Notice: Subject to any disclaimer, the term of this patent is extended or adjusted under 35 U.S.C. 154(b) by 0 days.

(21) Appl. No.: 09/813,261

(22) Filed: Mar. 20, 2001

(65) Prior Publication Data

US 2001/0040276 A1 Nov. 15, 2001

(30) Foreign Application Priority Data

Mar. 23, 2000 (JP) ......................................... 2000-082091

(51) Int. Cl.⁷ ............................................. H01L 23/495
(52) U.S. Cl. ....................................... 257/670; 257/667
(58) Field of Search .................................... 257/666, 670, 257/667; 438/123, 111

(56) References Cited

U.S. PATENT DOCUMENTS

| | | | | |
|---|---|---|---|---|
| 4,482,915 A | * | 11/1984 | Nishikawa et al. | |
| 4,496,965 A | * | 1/1985 | Orcutt et al. | |
| 4,791,473 A | * | 12/1988 | Phy | |
| 5,686,698 A | * | 11/1997 | Mahadevan et al. | |

* cited by examiner

Primary Examiner—Sheila V. Clark
(74) Attorney, Agent, or Firm—Wood, Phillips, Katz, Clark & Mortimer

(57) ABSTRACT

A lead frame for a semiconductor device. The lead frame has a layer defining a first unit lead frame including a first support for a semiconductor chip and a plurality of leads spaced around the first support. The first support has a peripheral edge. The layer further defines a guide rail extending along at least a portion of the peripheral edge and connected to at least one of the leads. At least one notch is formed in the layer between the at least one lead and a part of the guide rail so as to define a first tie bar.

30 Claims, 6 Drawing Sheets

LEAD FRAME FOR A SEMICONDUCTOR DEVICE AND METHOD OF MANUFACTURING A SEMICONDUCTOR DEVICE

BACKGROUND OF THE INVENTION

1. Field of the Invention

This invention relates to lead frames used to construct semiconductor devices. The invention is also directed to a method of forming a semiconductor device incorporating a lead frame.

2. Background Art

Recent demand for miniaturized, dense, resin-sealed semiconductor devices has lead to the development of semiconductor devices as shown at 10 in FIGS. 8 and 9. With this type of device, leads 12 are exposed at transverse back and side surfaces 14, 16, but do not project from either surface 14, 16. Such semiconductor devices 10 are commonly referred to in the industry as SON (Small Outline Non-leaded Packages) and QFN (Quad Flat Non-leaded Packages).

The semiconductor device 10 consists of a unit lead frame 17 with a rectangular support 18 having a surface 20 to which a semiconductor chip 22 is bonded. Four leads 12, which are part of the unit lead frame 17, are spaced around, and project from, each of four sides on a peripheral edge 24 on the support 18, and are electrically connected to the semiconductor chip 22 through conductive wires 26. The support 18, semiconductor chip 22, and wires 26 are sealed by a solidified resin material 28 to form an overall squared configuration for the semiconductor device 10.

The unit lead frame 17 is formed as part of a lead frame 30 (FIG. 10), which is in the form of a layer, which may be a belt, a strip, or a sheet of material. The lead frame 30 can be made from conductive material, such as copper or iron alloy, and may be processed, as by etching or the like, to produce the configuration shown in FIG. 10. The unit frame 17, shown in FIGS. 8 and 9, is shown in the hatched region in FIG. 10.

The lead frame 30 consists of several, and in this case nine, unit frames 17, 17a, 17b, 17c, 17d, 17e, 17f, 17g, 17h, having the same configuration as the unit lead frame 17, arranged in a matrix form and interconnected to each other and a guide rail 32 through a tie bar network 34.

Once the lead frame 30 is formed, the semiconductor chips 22 are secured on the support surfaces 20, as by using a binder or binding tape. An electrode 36 on each semiconductor chip 22 is electrically connected through a wire 26 to one of the leads 12. This subassembly is then resin sealed within the area bounded by the square border, as indicated by the line 38, which area encompasses a portion of the guide rail 32.

Once the resin is cured, a saw is used to cut lengthwise, in the direction of the arrow 40, along and through tie bars 42,44 between the unit frames 17, 17a, 17b and 17c, 17d, 17e and 17c, 17d, 17e and 17f, 17g, 17h. Two additional lengthwise cuts of width W are made as indicated at the lines 46, 48 where unit frames 17, 17a, 17b and unit frames 17f, 17g, 17h, respectively, are joined to the guide rail 32. Orthogonal cuts are made through tie bars 50, 52 and at lines 54, 56 to separate the individual semiconductor devices 10.

The process described above is desirable in that it permits simultaneous resin sealing of a plurality of semiconductor devices 10. With a common shape, a wide variety of products can be made.

However, there are a number of problems that result from the manufacturing process for the semiconductor device 10 described above with respect to FIGS. 8–10. One problem is a result of resin leakage which occurs at the guide rail 32. This problem can be explained with respect to exemplary unit frame 17, as shown also in FIG. 11. The resin 28 tends to migrate past the edges 58, 60 of the guide rail 32. By reason of the width of the guide rail 32, resin tends to accumulate on the back surface 14 over the leads 12, so as to form "resin flashes" 62, which are contiguous with the guide rail 32. If these resin flashes are not removed, they potentially prevent establishment of a proper electrical connection with a product to which the semiconductor device 10 is connected. As a result, the manufacturing process may require at last one additional step to remove the resin flashes 62.

Another problem relates to the resistance that is encountered as certain cuts, using a separating saw, or the like, are made. The tie bars 42, 44, 50, 52 can be cut with little resistance by the saw. The tie bars 42, 44, 50, 52 may have a width W1 (shown for exemplary tie bar 42 in FIG. 10) that is less than the width W of a cutting blade on the saw. However, the cuts at 46, 48, 54, 56 must be made through the solid guide rail 32 so that a cut equal to the width W of the saw blade is made in the guide rail 32. With the width W of the saw greater than the width W1 of the tie bars 42, 44, 50, 52, relatively little cutting resistance may be encountered, whereas in cutting the full width of the guide rail 32, there may potentially be a significantly higher resistance to cutting. This condition may lead to a peeling off of the leads 12 and/or the resin material 28 from the guide rail 32 and/or deformation of the guide rail 32 during the cutting process.

SUMMARY OF THE INVENTION

In one form, the invention is directed to a lead frame for a semiconductor device. The lead frame has a layer defining a first unit lead frame including a first support for a semiconductor chip and a plurality of leads spaced around the first support. The first support has a peripheral edge. The layer further defines a guide rail extending along at least a portion of the peripheral edge and connected to at least one of the leads. At least one notch is formed in the layer between the at least one lead and a part of the guide rail so as to define a first tie bar.

The lead frame may further include a second unit lead frame defined by the layer and connected to the first unit lead frame by at least a second tie bar. The second unit lead frame has a second support for a semiconductor chip and a plurality of leads spaced around the second support. The second support has a peripheral edge.

The second tie bar may connect between leads on the first and second unit lead frames.

In one form, this first support has a polygonal shape with a peripheral edge. The peripheral edge of the first support has first and second transverse, substantially straight edge portions. A guide rail extends along the first and second edge portions. At least one notch is located between the first edge portion and a part of the guide rail. There is a second notch in the layer between the second edge portion and another part of the guide rail.

The first and second notches may extend fully through the layer.

In one form, the first unit lead frame consists of a plurality of leads extending along the first edge portion a first distance. In one form, the at least one notch extends along the first edge a distance equal to at least the first distance.

The first unit lead frame may include a plurality of leads extending along the first edge portion, with the first tie bar connected between the plurality of leads.

In one form, there is a third tie bar that connects between the first tie bar and the part of the guide rail.

The invention is also directed to a lead frame for a plurality of semiconductor devices, which lead frame has a layer defining a plurality of unit lead frames each consisting of a support for a semiconductor chip and a plurality of leads spaced around the support. The support has a peripheral edge. The layer defines a guide rail. The layer further defines a first tie bar connecting to a lead on a first unit lead frame in the plurality of unit lead frames and a second tie bar connecting between the first tie bar and a part of the guide rail.

The peripheral edge of the support on the first unit lead frame may be polygonal with first and second transverse, substantially straight, edge portions. The first tie bar may extend substantially parallel to the first edge portion, with the second tie bar extending transversely to the first edge portion.

The first tie bar may connect to a lead connected to the first edge portion.

In one form, there is a third tie bar that extends substantially parallel to the second edge portion. There is a fourth tie bar that connects between the third tie bar and another part of the guide rail. The third tie bar is connected to a lead connected to the second edge portion.

The part and the another part of the guide rail may each be elongate and extend substantially orthogonally to each other.

In one form, there are interconnected tie bars that extend substantially continuously fully around the support on the first unit lead frame.

In one form, a plurality of the interconnected tie bars define a shape around the peripheral edge of the first unit lead frame corresponding to a shape of the peripheral edge of the first unit lead frame.

The shape of the peripheral edge of the first unit lead frame may be substantially square.

In one form, the layer is a conductive sheet.

A plurality of the interconnected tie bars may have a substantially uniform width substantially fully around the peripheral edge of the first unit lead frame.

The invention is also directed to a lead frame for a plurality of semiconductor devices. The lead frame has a layer defining first and second unit lead frames each including a support for a semiconductor chip and a plurality of leads spaced around each support. The first and second unit lead frames are connected to each other through a tie bar network. The lead frame further includes a guide rail. The first unit lead frame is connected to the guide rail by at least a first tie bar and to the second unit lead frame by at least a second tie bar. The at least first and second tie bars have a width that is substantially the same.

In one form, a plurality of the tie bars have substantially the same width and extend substantially fully around the support on the first unit lead frame.

In one form, the support of the first unit lead frame has a peripheral edge with a polygonal shape and a plurality of tie bars that extend around the support on the first unit lead frame have a shape substantially corresponding to the shape of the peripheral edge on the first unit lead frame.

The invention is also directed to a method of manufacturing semiconductor devices. The method includes the steps of: forming a conductive layer consisting of a first plurality of unit lead frames each having a support for a semiconductor chip, a plurality of leads spaced around the support, and a tie bar network which interconnects the support to the leads on each of the unit lead frame and the plurality of unit lead frames to each other, the step of forming a conductive layer further including connecting the plurality of unit lead frames to a guide rail so that a second plurality of unit lead frames within the first plurality of unit lead frames are connected to the guide rail through the tie bar network and so that there are a plurality of tie bars which extend substantially fully around the support on each of the unit lead frames in the second plurality of unit lead frames; placing a semiconductor chip on each support on each of the first plurality of unit lead frames; electrically connecting the semiconductor chip on each unit lead frame to the respective leads on each unit lead frame; resin sealing at least a part of the conductive layer and a plurality of the semiconductor chips; and separating individual semiconductor devices by cutting through the tie bars which extend substantially fully around the support on each of the unit lead frames in the second plurality of unit lead frames.

In one form, the tie bar network consists of a plurality of tie bars that connect the plurality of tie bars, which extend substantially fully around the support on each of the unit lead frames in the second plurality of unit lead frames, to the guide rail.

In one form, the plurality of tie bars which extend substantially fully around the support on each of the unit frames in the second plurality of unit frames have a substantially uniform width.

The method may further include the step of bonding a semiconductor chip to each of the supports on each of the first plurality of unit lead frames.

The semiconductor chips may be bonded to the supports using at least one of a paste and tape.

The step of forming a conductive layer may involve forming a conductive layer through a sputtering process or through an etching process.

The step of resin sealing may be carried out using an epoxy.

The step of separating individual semiconductor devices may involve cutting using a saw.

DETAILED DESCRIPTION OF THE DRAWINGS

Figure 1:
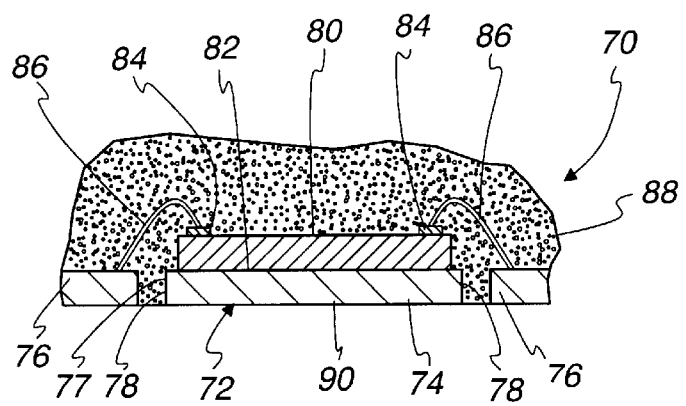
FIG. 1 is a cross-sectional view of a semiconductor device, incorporating a unit lead frame, and made according to the present invention.
Figure 2:
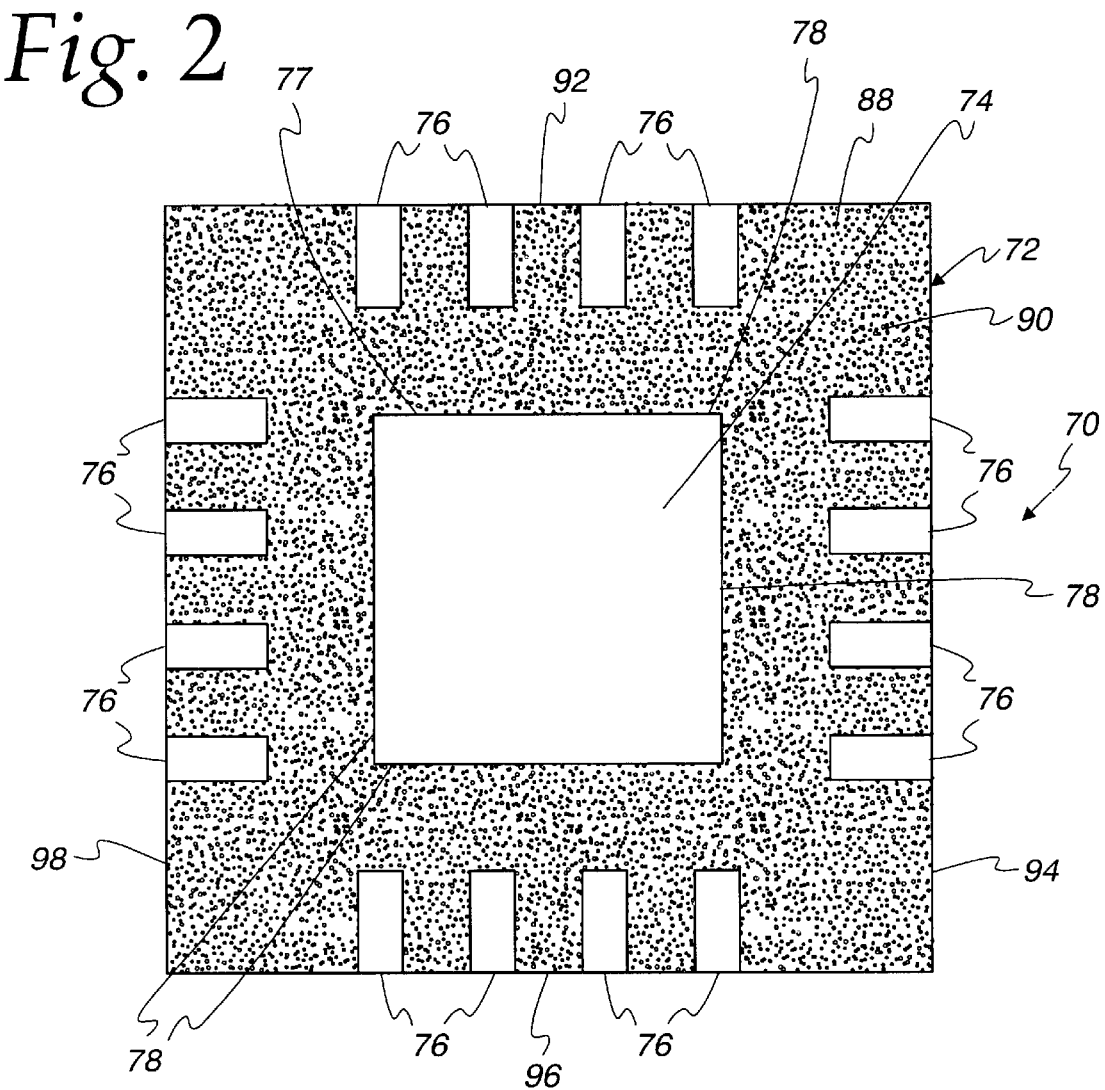
FIG. 2 is a bottom view of the semiconductor device of FIG. 1.

Referring initially to FIGS. 1 and 2, a semiconductor device, made according to the invention, is shown at 70. The semiconductor device 70 has a structure similar to that of the semiconductor device 10. The semiconductor device 70 incorporates a unit lead frame 72, consisting of a polygonally-shaped support 74 with a plurality of leads 76 spaced outwardly from the peripheral edge 77 of the support 74. In this embodiment, the support 74 is square, with four leads 76 on each of four portions 78 cooperatively defining the edge 77.

A semiconductor chip 80 is adhered to a flat surface 82 on the support 74. Electrodes 84 on the semiconductor chip 80 are electrically connected to the leads 76 through conductive wires 86. A resin sealing material 88 is applied over the unit lead frame 72, the semiconductor chip 80, and the wires 86 to complete the semiconductor device 70, which has a resulting squared configuration. The leads 76 on the completed device 70 are exposed at a flat bottom surface 90 and four transverse side surfaces 92, 94, 96, 98, which are orthogonal to the flat bottom surface 90.

The completed semiconductor device 70 shown has a quadrangular plane form and is a type commonly referred to in the industry as a SON (Small Outline Non-leaded Package) or a QFN (Quad Flat Non-leaded Package).

Figure 3:
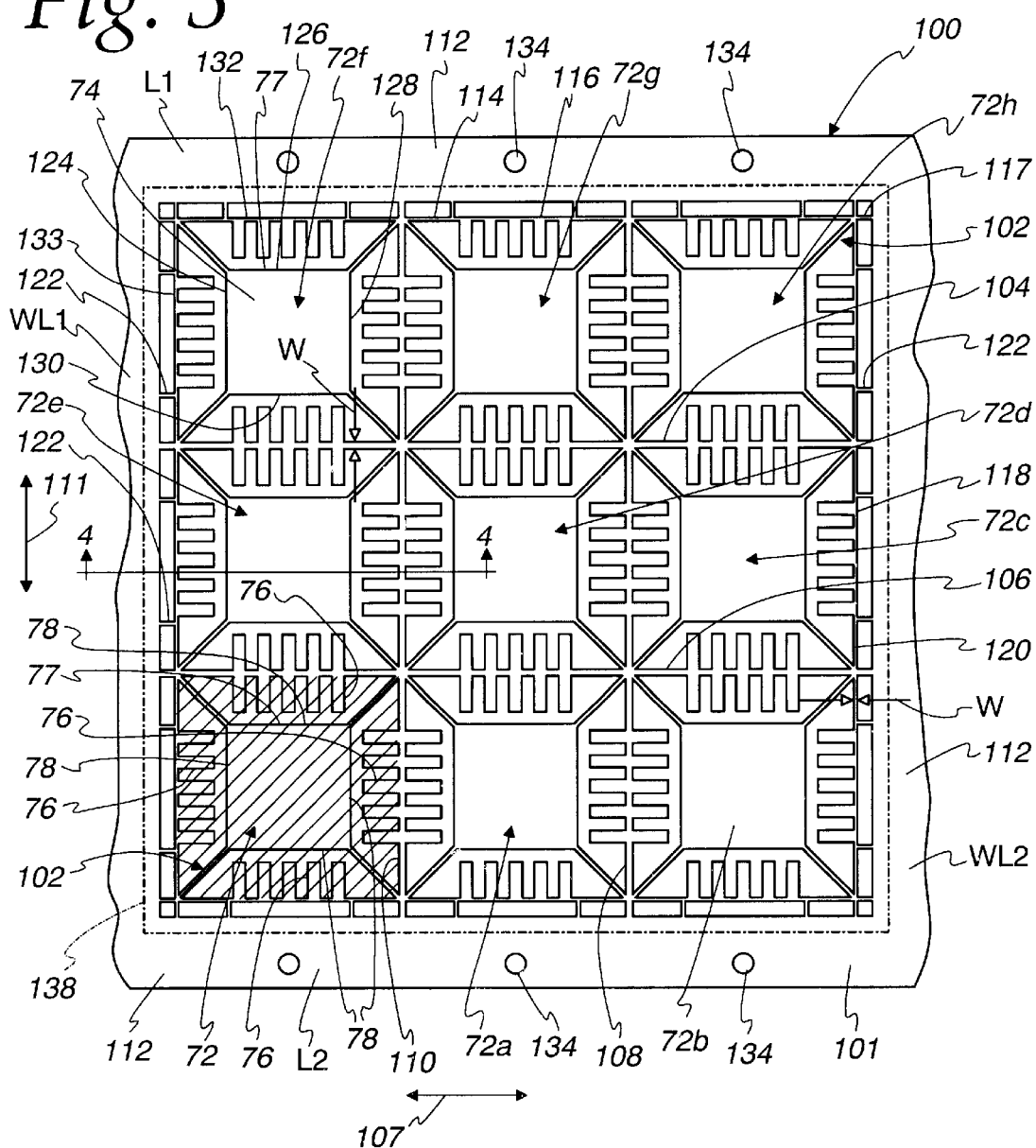
FIG. 3 is a fragmentary, plan view of a lead frame which has a matrix of interconnected unit lead frames of the type incorporated into the semiconductor device in FIG. 1.

In FIG. 3, the unit lead frame 72 is identified by hatching as a part of a lead frame 100, in the form of a web, strip, or belt, 101 upon which similarly configured unit lead frames 72a, 72b, 72c, 72d, 72e, 72f, 72g, 72h are simultaneously formed in a 3×3 matrix form.

The unit lead frames 72,72a–h are interconnected through a tie bar network at 102. Straight, elongate tie bars 104, 106 in the tie bar network 102, extend in a lengthwise direction, as indicated by the double-headed arrow 107, and respectively join unit lead frames 72f, 72g, 72h with unit lead frames 72c, 72d, 72e and unit lead frames 72c, 72d, 72e with unit lead frames 72, 72a, 72b. The tie bars 104, 106 have a width W which is preferably less than the width of a conventional type cutting blade on a saw used to cut through the tie bars 104, 106, as described hereafter. Similar tie bars 108, 110, extending widthwise relative to the lead frame 100, as indicated by the double-headed arrow 111, respectively join unit lead frames 72b, 72c, 72h with unit frames 72a, 72d, 72g and unit frames 72a, 72d, 72g with unit lead frames 72, 72e, 72f.

The lead frame 100 is preferably a conductive layer which defines the unit frames 72, 72a–72h and a guide rail 112 which extends around the matrix of unit lead frames 72, 72a–72h.

According to the invention, small and large rectangular notches 114, 116 and corner notches 117 are formed in, and preferably through, the guide rail 112 around the entire peripheral edge 118 of the matrix of unit lead frames 72, 72a–h. The guide rail 112 has two lengthwise legs L1, L2 and two orthogonal widthwise parts WL1, WL2 framing the matrix of unit lead frames.

Each notch 114, 116, 117, resides between a unit lead frame and a part of the guide rail 112 around the entire peripheral edge 118. The large notches 116 preferably span a distance at least equal to the combined distance that the leads 76 extend along the adjacent and parallel support edge portions 78 (for unit lead frame 72). The notches 114, 116, 117 are arranged and configured to produce a tie bar assembly 120, of uniform width, which extends continuously around the matrix of unit frames 72, 72a–h, and actually defines, the peripheral edge 118 of the matrix. While the notches 114, 116, 117 are shown to be rectangular in shape other shapes that produce a tie bar assembly of reduced width over a significant part of the periphery of the unit frame matrix is contemplated by the invention. The peripheral tie bar assembly 120 preferably has the same width W as the tie bars 104, 106, 108, 110. Between adjacent notches 114, 116, tie bars 122 extend orthogonally to the peripheral tie bar assembly 120 between each unit lead frame 72, 72a–72h and the guide rail 112.

With this construction, as seen for exemplary unit lead frame 72f, the peripheral edge 77 of the support 74 is fully surrounded by tie bars of substantially uniform width. In this embodiment, the support 74 is bounded by straight edge portions 124, 126, 128, 130. Two transverse portions 132, 133 of the tie bar assembly 120 and portions of the tie bars 110, 104 extend generally parallel to the edge portions 126, 124, 128, 130, respectively, so that the shape of the surrounding tie bar portions corresponds to the shape of the peripheral edge 77 of the support 74.

For purposes of facilitating handling of the lead frame 100, guide holes 134 are punched therethrough at the guide rail 112.

Figure 4:
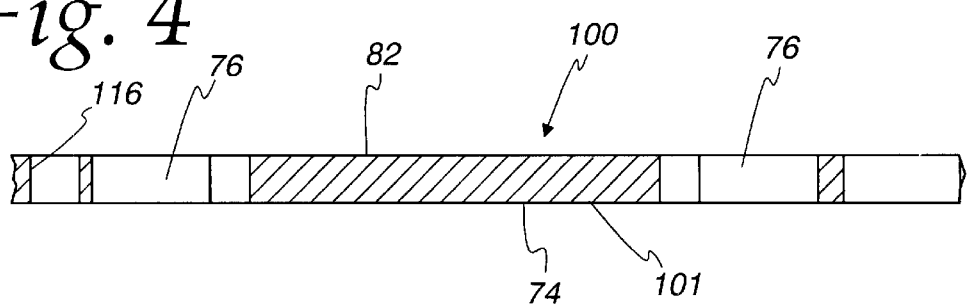
FIG. 4 is a cross-sectional view taken along line 4—4 of FIG. 3.
Figure 12:
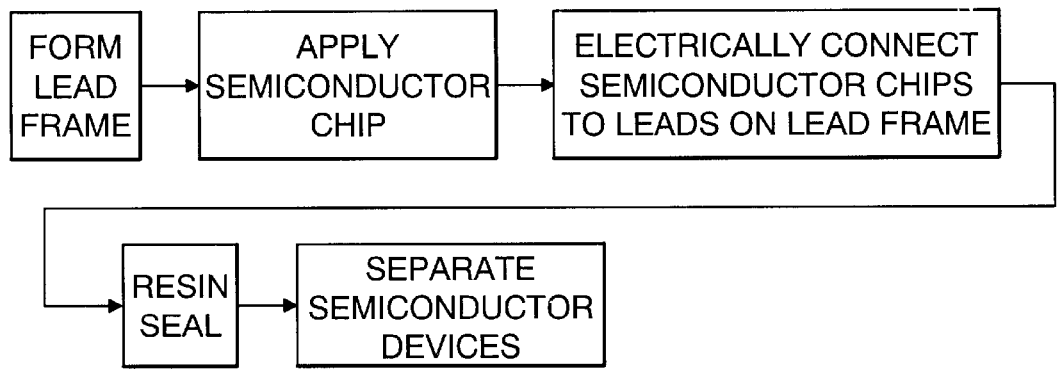
FIG. 12 is a schematic representation of a process for forming semiconductor devices, according to the present invention.

The method of manufacturing the lead frame 100, and the semiconductor device 70, according to the invention, will now be described. As shown in FIGS. 3, 4 and 12, the lead frame 100 is formed from a layer 101, made from a metal sheet, of copper, iron alloy, or the like, in belt or continuous strip form, and is treated either by a sputtering or etching process, to produce the matrix arrangement of unit lead frames shown in FIG. 3.

Figure 5:
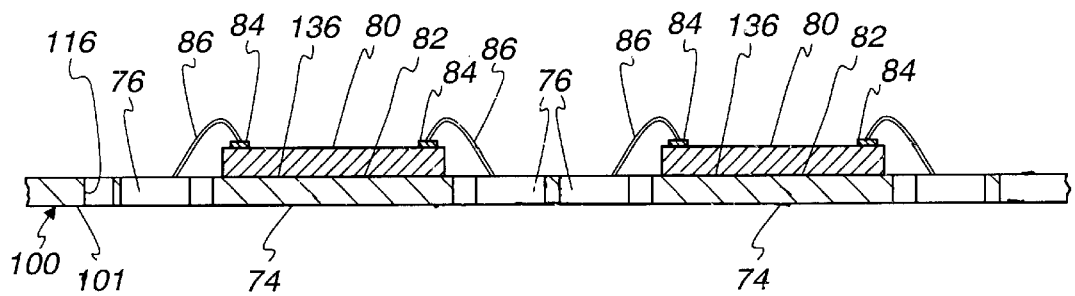
FIG. 5 is a view as in FIG. 4 with semiconductor chips applied to the lead frame and electrically connected to leads on the lead frame.

As shown in FIG. 5, semiconductor chips 80 are then adhered to the surfaces 82 of the supports 74. This adhesion may be effected through any known means, such as by silver paste, binding tape, or the like, as shown at 136. The electrodes 84 are then connected to the leads 76 using the wires 86.

Figure 6:
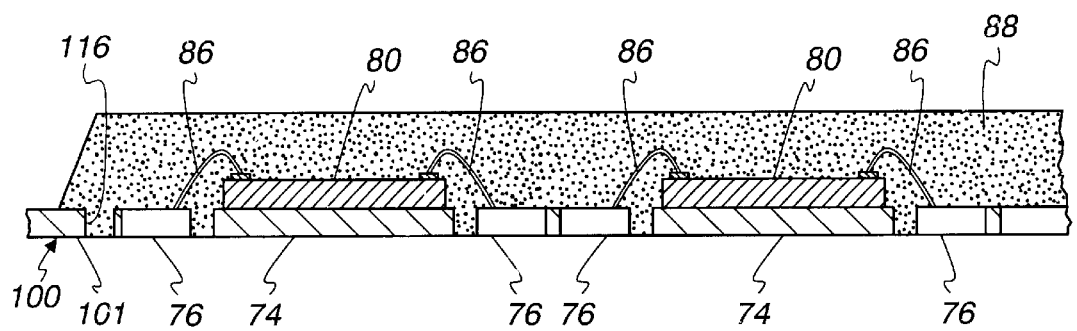
FIG. 6 is a view as in FIG. 5 showing a resin seal on the lead frame.

Then, as shown in FIG. 6, the lead frame 100 with the matrix arrangement of unit lead frames, and semiconductor chips 80 and wires 86 operatively connected, are covered with a layer of sealing resin 88 such as epoxy, within a rectangular frame identified by the line 138 in FIG. 3.

Figure 7:
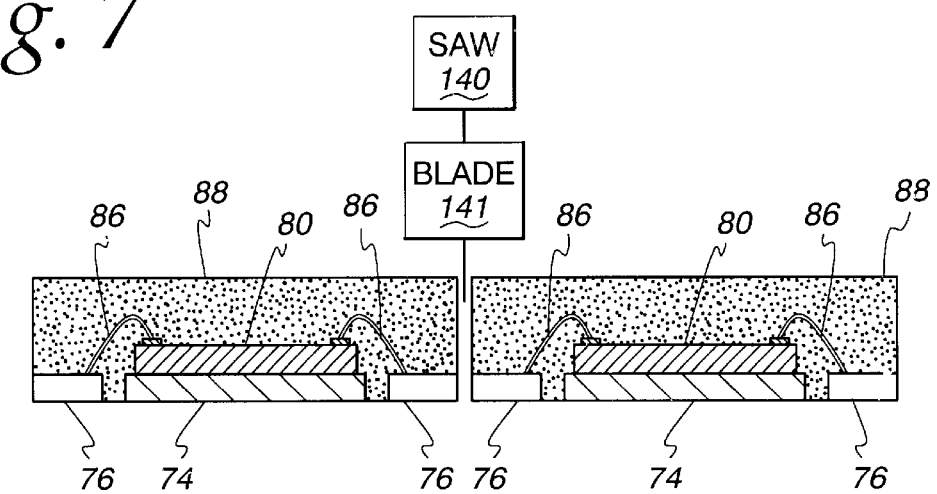
FIG. 7 is a view as in FIG. 6 with the individual semiconductor devices separated, each from the other.
Figure 8:
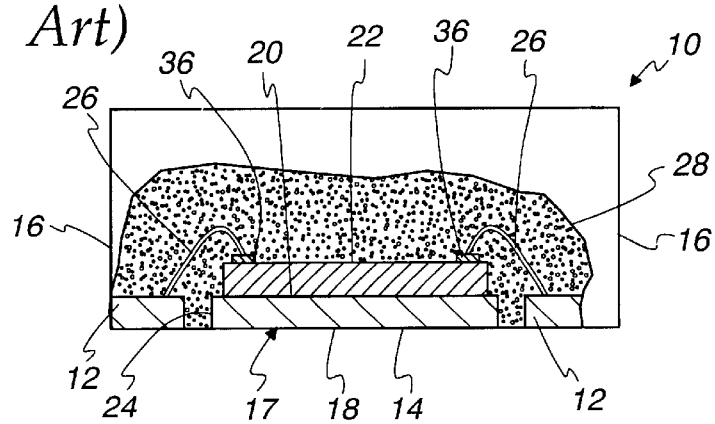
FIG. 8 is a cross-sectional view of a semiconductor device made according to a conventional process.
Figure 9:
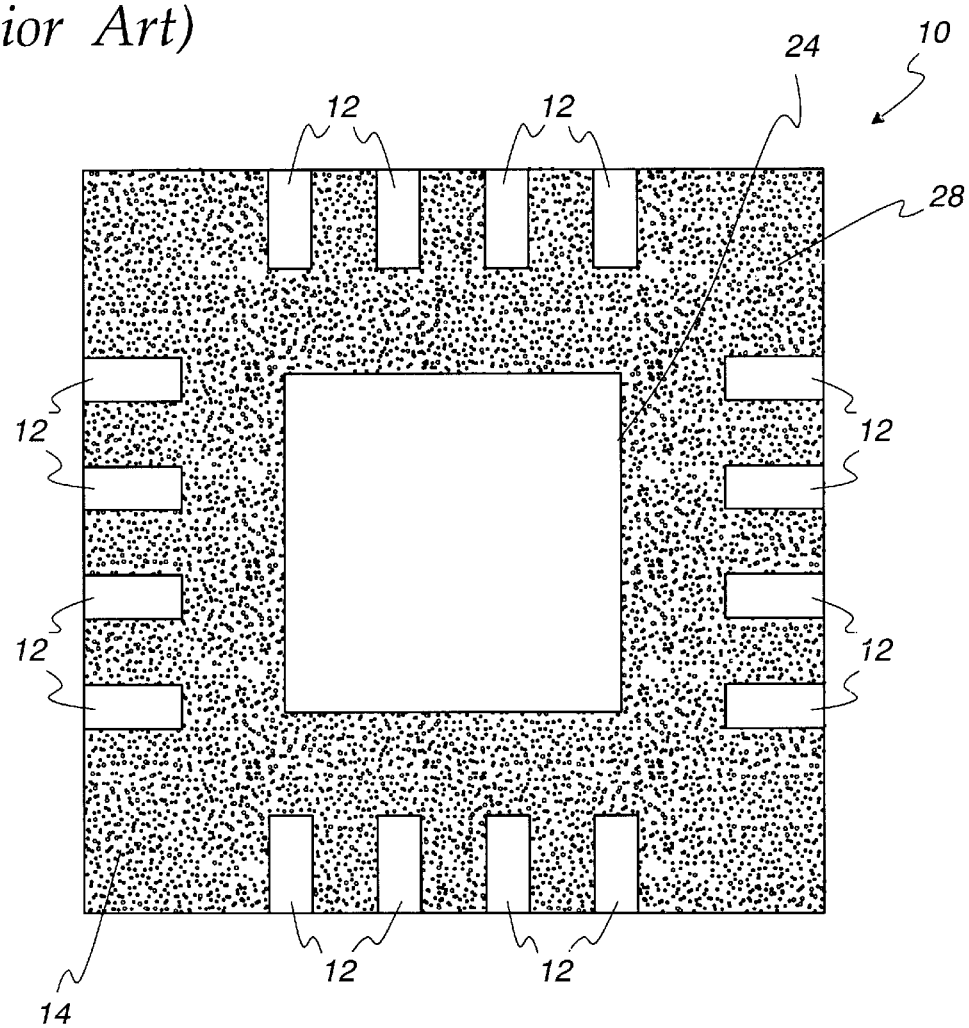
FIG. 9 is a bottom view of the semiconductor device of FIG. 8.

Then, as shown in FIG. 7, using a conventional saw 140 with a cutting blade 141, the individual semiconductor devices 70 are separated from the matrix by cutting along the tie bars. In the case of exemplary semiconductor 70, which integrates unit lead frame 72, the tie bar portions 106, 110 and transverse portions of the peripheral tie bar 120 are severed fully around the support 74 to complete the semiconductor device 70.

Figure 10:
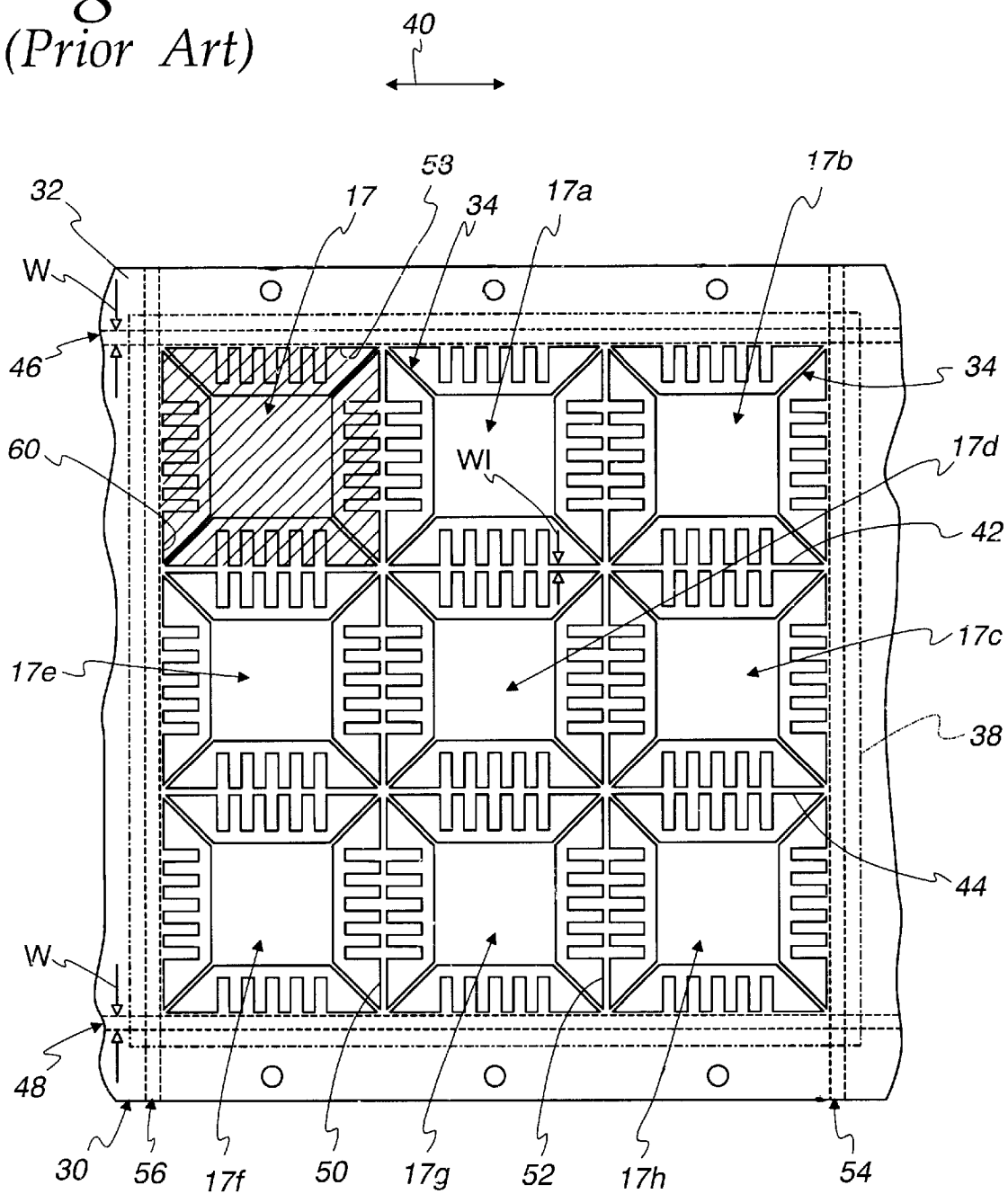
FIG. 10 is a fragmentary, plan view of a conventional lead frame used to make semiconductor devices as shown in FIGS. 1 and 2.
Figure 11:
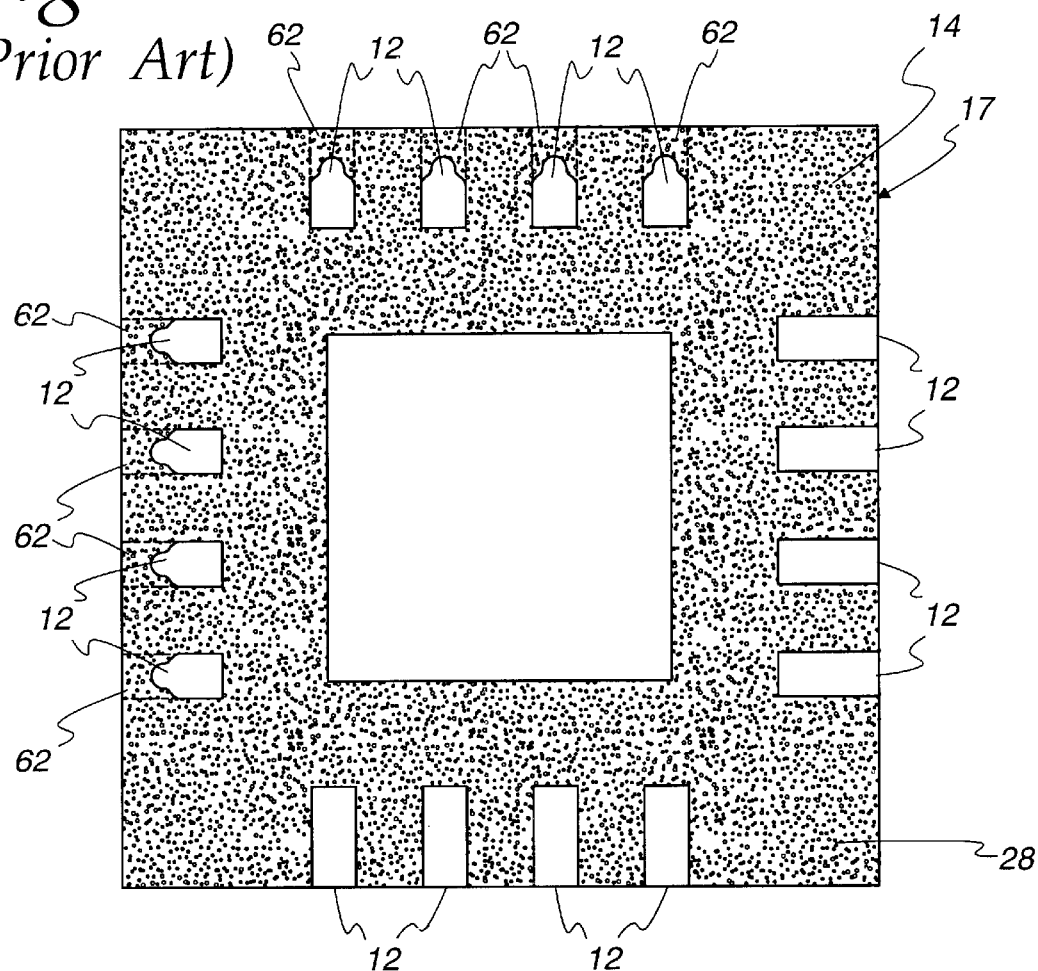
FIG. 11 is a view as in FIG. 2 and showing resin flash over some of the leads on a semiconductor device made by a conventional process.

With the construction shown, cutting can be effected to separate each semiconductor device 70 by cutting through only the narrow width W1 of the tie bar portions surrounding each unit lead frame. Because the wider guide rail 112 does not need to be cut to the full width W of the cutting blade 141 as is required on the lead frame of FIG. 10, there is less resistance to cutting. As a consequence, bending deformation of the guide rail 112 during cutting may be relatively insignificant, which reduces the likelihood of peeling of the leads 76 and the sealing resin 88 at the guide rail 112 during manufacture. Further, since cutting resistance may be made substantially uniform as the semiconductor devices 70 in the matrix are separated, stable, consistent and precise cutting can be effected.

Additionally, although resin leakage and flash occur at the guide rail 112 under the pressure occurring during resin sealing, the notches 114, 116, 117 minimize the occurrence of resin flash on the semiconductor devices 70. Instead, the resin flash occurs on the outer portions of the guide rail 112. Therefore, the need to remove resin flash from the leads 76 may be obviated. Economical production of high quality semiconductor devices may thus be facilitated by the invention.

The foregoing disclosure of specific embodiments is intended to be illustrative of the broad concepts comprehended by the invention.

What is claimed is:

1. A lead frame for a semiconductor device, said lead frame comprising:
   a layer defining a first unit lead frame comprising a first support for a semiconductor chip and a plurality of leads spaced around the first support,
   said first support having a peripheral edge,
   said layer further defining a guide rail extending along at least a portion of the peripheral edge and connected to at least one of the leads,
   there being at least one notch in the layer between the at least one lead and a part of the guide rail so as to define a first tie bar.

2. The lead frame for a semiconductor device according to claim 1 wherein the lead frame comprises a second unit lead frame defined by the layer and connected to the first unit lead frame by at least a second tie bar, said second unit lead frame comprising a second support for a semiconductor chip and a plurality of leads spaced around the second support, the second support having a peripheral edge.

3. The lead frame for a semiconductor device according to claim 2 wherein the second tie bar connects between leads on the first and second unit lead frames.

4. The lead frame for a semiconductor device according to claim 2 wherein the first support has a polygonal shape, the peripheral edge of the first support has first and second transverse substantially straight edge portions, the guide rail extends along the first and second edge portions, the at least one notch is located between the first edge portion and a part of the guide rail and there is a second notch in the layer between the second edge portion and another part of the guide rail.

5. The lead frame for a semiconductor device according to claim 4 wherein the first and second notches extend fully through the layer.

6. The lead frame for a semiconductor device according to claim 4 wherein the first unit lead frame comprises a plurality of leads extending along the first edge portion a first distance and the at least one notch extends along the first edge a distance equal to at least the first distance.

7. The lead frame for a semiconductor device according to claim 2 wherein the first unit lead frame comprises a plurality of leads extending along the first edge portion and the first tie bar connects between the plurality of leads.

8. The lead frame for a semiconductor device according to claim 7 wherein there is a third tie bar that connects between the first tie bar and the part of the guide rail.

9. A lead frame for a plurality of semiconductor devices, said lead frame comprising:
   a layer defining a plurality of unit lead frames each comprising a support for a semiconductor chip and a plurality of leads spaced around each support,
   each support having a peripheral edge,
   said layer defining a guide rail,
   said layer defining a first tie bar connected to a lead on a first unit lead frame in the plurality of unit lead frames,
   said layer further defining a second tie bar connecting between the first tie bar and a part of the guide rail.

10. The lead frame for a plurality of semiconductor devices according to claim 9 wherein the peripheral edge of the support on the first unit lead frame is polygonal with first and second transverse substantially straight edge portions, the first tie bar extends substantially parallel to the first edge portion and the second tie bar extends transversely to the first edge portion.

11. The lead frame for a plurality of semiconductor devices according to claim 10 wherein the first tie bar connects to a lead connected to the first edge portion.

12. The lead frame for a plurality of semiconductor devices according to claim 11 wherein there is a third tie bar that extends substantially parallel to the second edge portion and there is a fourth tie bar that connects between the third tie bar and another part of the guide rail, the third tie bar connected to a lead connected to the second edge portion.

13. The lead frame for a plurality of semiconductor devices according to claim 12 wherein the part and the another part of the guide rail are each elongate and extend substantially orthogonally to each other.

14. The lead frame for a plurality of semiconductor devices according to claim 12 wherein there are interconnected tie bars that extend substantially continuously fully around the support on the first unit lead frame.

15. The lead frame for a plurality of semiconductor devices according to claim 14 wherein a plurality of the interconnected tie bars define a shape around the peripheral edge of the first unit lead frame corresponding to a shape of the peripheral edge of the first unit lead frame.

16. The lead frame for a plurality of semiconductor devices according to claim 15 wherein the shape of the peripheral edge of the first unit frame is substantially square.

17. The lead frame for a plurality of semiconductor devices according to claim 16 wherein the layer comprises a conductive sheet.

18. The lead frame for a plurality of semiconductor devices according to claim 15 wherein the plurality of the interconnected tie bars have a substantially uniform width substantially fully around the peripheral edge of the first unit lead frame.

19. A lead frame for a plurality of semiconductor devices, said lead frame comprising:
   a layer defining first and second unit lead frames each comprising a support for a semiconductor chip and a plurality of leads spaced around each support,
   the first and second unit lead frames connected to each other through a tie bar network; and
   a guide rail,
   the first unit lead frame connected to the guide rail by at least a first tie bar and to the second unit lead frame by at least a second tie bar in the tie bar network,
   wherein the at least first and second tie bars have a width that is substantially the same.

20. The lead frame for a plurality of semiconductor devices according to claim 19 wherein there are a plurality of tie bars having substantially the same width that extend substantially fully around the support on the first unit lead frame.

21. The lead frame for a plurality of semiconductor devices according to claim 20 wherein the support on the first unit lead frame has a peripheral edge with a polygonal shape and the plurality of tie bars that extend around the support on the first unit lead frame have a shape substantially corresponding to the shape of the peripheral edge on the first unit lead frame.

22. A method of manufacturing a semiconductor device, said method comprising the steps of:

forming a conductive layer comprising a first plurality of unit lead frames each comprising a support for a semiconductor chip, a plurality of leads spaced around the support and a tie bar network which interconnects the support to the leads on each unit lead frame and the plurality of unit lead frames to each other, the step of forming a conductive layer further comprising connecting the plurality of unit lead frames to a guide rail so that a second plurality of the unit lead frames within the first plurality of unit lead frames are connected to the guide rail through the tie bar network and so that there are a plurality of tie bars which extend substantially fully around the support on each of the unit lead frames in the second plurality of unit lead frames;

placing a semiconductor chip on each support on each of the first plurality of unit lead frames;

electrically connecting the semiconductor chip on each unit lead frame to the respective leads on each unit lead frame;

resin sealing at least a part of the conductive layer and a plurality of the semiconductor chips; and separating individual semiconductor devices by cutting through the tie bars which extend substantially fully around the support on each of the unit lead frames in the second plurality of unit lead frames.

23. The method of manufacturing semiconductor devices according to claim 22 wherein the tie bar network comprises a plurality of tie bars that connect the plurality of tie bars, which extend substantially fully around the support on each of the unit lead frames in the second plurality of unit lead frames, to the guide rail.

24. The method of manufacturing semiconductor devices according to claim 22 wherein the plurality of tie bars which extend substantially fully around the support on each of the unit lead frames in the second plurality of unit lead frames have a substantially uniform width.

25. The method of manufacturing semiconductor devices according to claim 22 further comprising the step of bonding a semiconductor chip to each of the supports on each of the first plurality of unit lead frames.

26. The method of manufacturing semiconductor devices according to claim 25 wherein the semiconductor chips are bonded to the supports using at least one of a paste and tape.

27. The method of manufacturing semiconductor devices according to claim 22 wherein the step of forming a conductive layer comprises forming a conductive layer through a sputtering process.

28. The method of manufacturing semiconductor devices according to claim 22 wherein the step of forming a conductive layer comprises forming a conductive layer through an etching process.

29. The method of manufacturing semiconductor devices according to claim 22 wherein the step of resin sealing is carried out using an epoxy.

30. The method of manufacturing semiconductor devices according to claim 22 wherein the step of separating individual semiconductor devices comprises cutting using a saw.

* * * * *